United States Patent
Itani

(10) Patent No.: US 7,595,509 B2
(45) Date of Patent: Sep. 29, 2009

(54) SINGLE CRYSTAL WAFER FOR SEMICONDUCTOR LASER

(75) Inventor: Kenya Itani, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 126 days.

(21) Appl. No.: 11/259,086

(22) Filed: Oct. 27, 2005

(65) Prior Publication Data

US 2006/0169988 A1 Aug. 3, 2006

(30) Foreign Application Priority Data

Feb. 3, 2005 (JP) ............................. 2005-028132

(51) Int. Cl.
*H01L 27/15* (2006.01)
(52) U.S. Cl. ................. 257/79; 257/E29.106; 438/690; 372/43.01
(58) Field of Classification Search ................. 438/690, 438/33; 257/79, E29.106
See application file for complete search history.

(56) References Cited

U.S. PATENT DOCUMENTS

| | | | | |
|---|---|---|---|---|
| 6,113,463 A | * | 9/2000 | Hasegawa et al. ............... | 451/6 |
| 6,113,721 A | * | 9/2000 | Secco d'Aragona et al. | 156/154 |
| 6,452,091 B1 | * | 9/2002 | Nakagawa et al. .......... | 136/261 |
| 2002/0019198 A1 | * | 2/2002 | Kamono ..................... | 451/41 |
| 2005/0280800 A1 | * | 12/2005 | Laiding et al. ................ | 355/77 |

FOREIGN PATENT DOCUMENTS

| | | | |
|---|---|---|---|
| JP | 2000-68171 A | | 3/2000 |
| JP | 2000068171 A | * | 3/2000 |
| JP | 2001-351836 A | | 12/2001 |
| JP | 2004-200529 A | | 7/2004 |

* cited by examiner

*Primary Examiner*—Chuong A Luu
*Assistant Examiner*—Ajay K Arora
(74) *Attorney, Agent, or Firm*—Foley & Lardner LLP

(57) ABSTRACT

A surface of the single crystal wafer 5 for semiconductor laser having an orientation flat formed by cleaving is polished by using the abrasive cloth 8 with high hardness under the optimized pressure for pushing the wafer and polishing rate, such that the polishing rate on the whole surface of the respective wafer 5 becomes uniform. The facet roll-off D occurred at a ridge of a cleavage surface 4 of the single crystal wafer 5 for semiconductor laser to be equal to or less than 40 μm. The single crystal wafer for a semiconductor laser of the present invention can provide an improvement in a precision of an optical alignment of mask pattern using the cleavage surface as a reference, and an improvement in process yield.

12 Claims, 5 Drawing Sheets

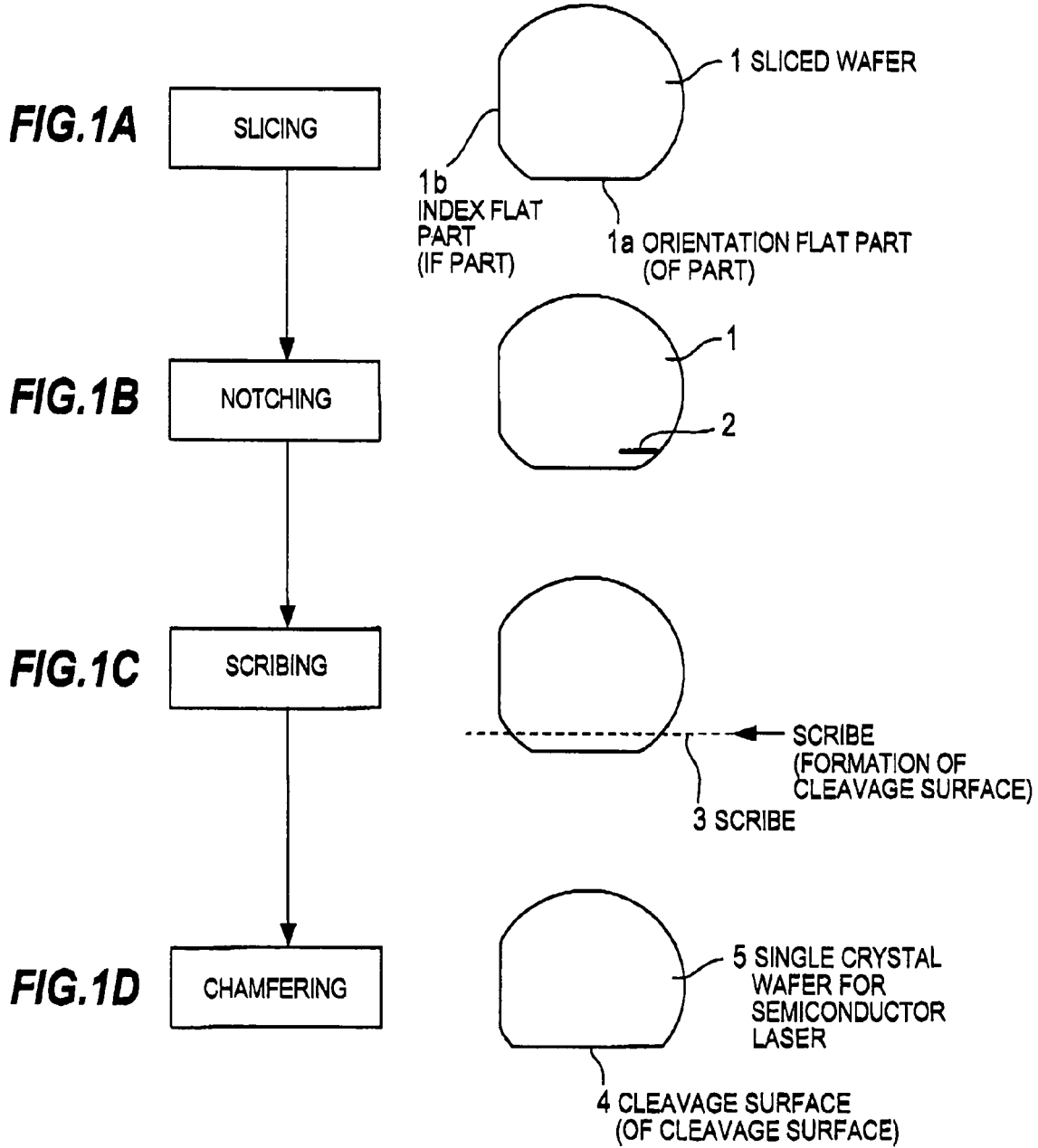

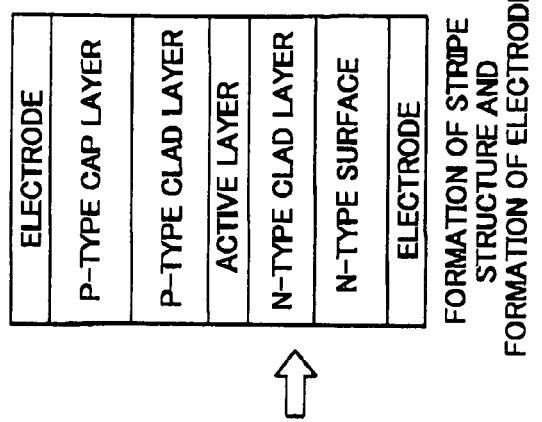
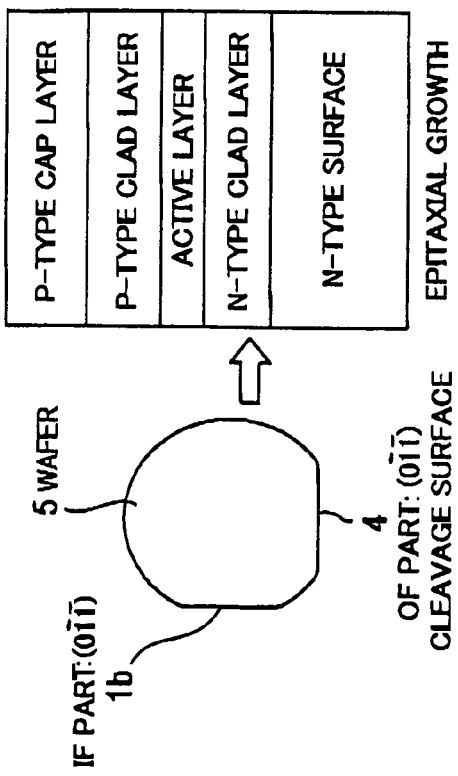
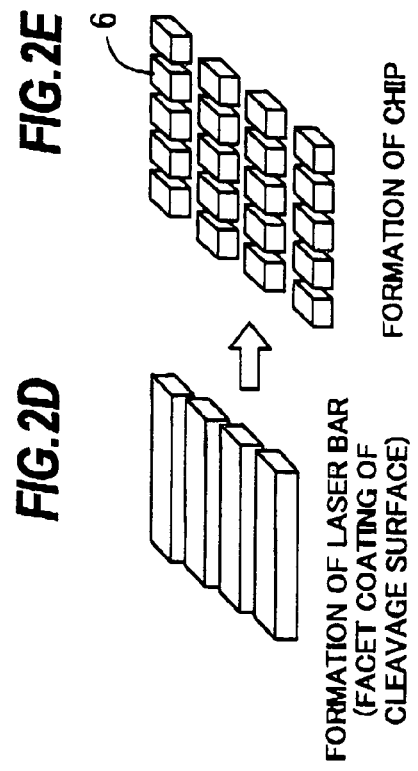

5 WAFER
PART FOR MEASURING FACET ROLL-OFF
IF PART
7 MIRROR SURFACE
4 OF PART (CLEAVAGE SURFACE)

DIFFICULT TO FOCUS
D > 40 μm
D : FACET ROLL-OFF
4 CLEAVAGE SURFACE

SINGLE CRYSTAL WAFER FOR SEMICONDUCTOR LASER

The present application is based on Japanese Patent Application No. 2005-028132 filed on Feb. 3, 2005, the entire contents of which are incorporated herein by reference.

BACKGROUND OF THE INVENTION

1. Field of the Invention

The present invention relates to a single crystal wafer for a semiconductor laser, and more particularly, to a single crystal wafer for a semiconductor laser with an optimized cross section of a ridge of a cleavage surface composing an orientation flat.

2. Description of the Related Art

A semiconductor wafer has been used as a substrate for devices such as shot key gate field-effect transistor (MESFET), high mobility transistor (HEMT), hetero-junction bipolar transistor (HBT), laser diode (LD), and light emitting diode (LED), etc. An active layer of such devices is formed on a surface of a mirror surface wafer fabricated from a semiconductor wafer, by using Molecular Beam Epitaxy (MBE), MetalOrganic Vapor Phase Epitaxial Growth (MOVPE), or Ion implantation method.

For fabricating such a mirror surface wafer, at first, a crystal ingot is sliced with a predetermined thickness, and a wafer is obtained. Then, the sliced wafer is lapped by alumina abrasive grain of #800 to #3000 to remove a saw mark from the sliced wafer, thereby improving a surface smoothness. Thereafter, so-called "polishing" process, i.e. a process for finishing the wafer surface in a mirror surface by mechanochemical polishing, is conducted by using a hypochlorous acid system aqueous solution or a mixture of hypochlorous acid aqueous solution and abrasive grain (silica, alumina, zirconium) as a polishing liquid, and a cloth having a porous layer on its surface is used as an abrasive cloth. Next, the finished mirror surface is washed by using a predetermined method and dried out. The dried mirror surface wafer is accommodated in a wafer tray or a wafer box.

On the other hand, when a compound semiconductor wafer is utilized for a semiconductor laser, the compound semiconductor may be provided with a cleavage surface as a reference surface, for the reason that an excellent smoothness of a resonant (lasing) plane is required, and that determination, alignment and focusing of crystal orientation are required. In particular, according to the specification of the compound semiconductor wafer product for semiconductor laser, an orientation flat part (OF part) or an index flat part (IF part) should be composed of a cleavage surface. The reason is as follows. In manufacturing a semiconductor laser diode, after forming an epitaxial layer on the wafer, it is necessary to cut the compound semiconductor wafer accurately along a cleavage surface to obtain a chip. Therefore, an angle adjustment should be conducted by using the OF part or the IF part composing of the cleavage surface as a reference.

Process of forming a cleavage surface of the OF part will be explained with referring to FIGS. 1A to 1D.

As shown in FIG. 1A, a single crystal ingot is sliced to provide a sliced wafer 1 having an OF part 1a and IF part 1b. Then, as shown in FIG. 1B, a short scratch (a notch) 2 is formed on a top surface or a back surface of the sliced wafer 1 by using a diamond pen, and a stress is applied thereto. A cleavage surface is obtained by scribing the sliced wafer 1 along a dotted line 3 (FIG. 1C). Thereafter, the sliced wafer 1 is chamfered such that the cleavage surface remains, and stepped portions on the cleavage surface due to the scribing cut is removed (FIG. 1D), to form an excellent cleavage surface (OF cleavage surface) 4, thereby providing a desired single crystal wafer 5 for a semiconductor laser.

FIG. 2 A shows a shape of a single crystal wafer for a semiconductor laser, and FIGS. 2B to 2E show an outline of a process for fabricating a semiconductor laser diode (LD) chip 6 using a single crystal wafer 5 for semiconductor laser fabricated as described above. Herein, a case of using a GaAs single crystal wafer is shown as a representative example. As shown in FIGS. 2B to 2E, this LD chip 6 is fabricated by a process comprising respective steps of (1) epitaxial growth, (2) formation of stripe structure, (3) formation of electrode, (4) formation of laser bar (facet coating of cleavage surface), (5) formation of chip (dicing), and (6) chip assembling.

In the semiconductor laser diode, an optical waveguide composing a resonator is formed within a semiconductor crystal. The optical waveguide has an elongated shape with a width of several micrometers and a length of several hundreds micrometers, and a reflection mirror is formed on both ends of the LD chip. In the GaAs single crystal wafer having a (100) plane as a surface, a longitudinal axis of the waveguide is formed in a direction perpendicular to the orientation flat (OF: <011> plane). The reflection mirror is formed automatically by "cleavage", which is inherent in the III-V group compound semiconductor fabrication process.

As described above, when the semiconductor laser chip using the GaAs single crystal wafer is fabricated, a cleavage surface showing a crystal orientation [011] is used as a reference, and the chip is cut by cleaving in a direction perpendicular thereto, so as to employ the cleavage surface of the chip as a resonant plane. Therefore, it is important to obtain a parallelism between the cleavage surface and a mask pattern in formation of the mask pattern, so that the OF cleavage surface and the mask pattern are generally aligned by using a microscope.

In the conventional arts of forming the orientation flat (OF) itself, when the angle adjustment is conducted by using an optical method, e.g. by using the microscope, since a cross section of a ridge of the OF part is curved, it is difficult to focus a microscope observation image on the OF part in a state where the operator observes the OF part from a point of view beneath a mirror surface, so that a precision in angle adjustment is deteriorated. For facilitating the focusing on the OF part in alignment of the mask pattern, Japanese Patent Application Laid-Open (Kokai) No. 2000-068171 proposes a semiconductor wafer, in which an OF part is not chamfered and only side edges are processed by machining. Further, Japanese Patent Application Laid-Open (Kokai) NO. 2001-351836 proposes a semiconductor wafer, in which an OF part is formed by cylindrical grinding operation of a single crystal ingot, and an error in a crystal orientation of the OF part is measured thereafter, and the measured error is corrected by machining.

However, these prior arts do not refer to a relationship between the aforementioned "polishing" process and a "facet roll-off" formed at the OF cleavage surface.

Herein, the "facet roll-off" means a roundness (curvature) of a ridge of the OF cleavage surface 4 (a ridge angle made by a mirror surface 7 and the OF cleavage surface 4) as shown in FIG. 3B. A degree of the "facet roll-off" is expressed by a distance D from the mirror surface to a border between a curved part and a flat part, measured along the OF cleavage surface 4 (in a vertical direction).

According to investigation of an Inventor of the present invention, following disadvantage in the polishing process was found. A variation occurs in polishing conditions for finishing the chip surface into a mirror surface by "polishing"

process. For example, if the polishing liquid is not provided around the surface of the wafer uniformly, a variation occurs in polishing rate on a plane of a wafer carrier plate, which functions as an affixing plate of the wafers. In addition, a processing pressure of the wafer varies in accordance with a variation of the number of wafers affixed on the wafer supporting plate. Such a variation of the polishing conditions causes the facet roll-off at an outer periphery of the wafer including the OF cleavage surface (D>40 μm, see FIGS. 3A and 3B), so that it becomes difficult to focus on the OF cleavage surface using the microscope in the alignment of the mask pattern, thereby deteriorating the precision in the alignment of the mask pattern.

SUMMARY OF THE INVENTION

Accordingly, it is an object of the invention to solve the above problems, and to provide a single crystal wafer for a semiconductor laser, which can realize an improvement in a precision of an optical alignment of mask pattern using the cleavage surface as a reference, and an improvement in process yield.

According to a first feature of the present invention, a single crystal wafer for a semiconductor laser, comprises:
a surface of a main plane;
a cleavage surface composing an orientation flat part; and
a ridge made by the surface of the main plane and the cleavage surface;
wherein the ridge has a facet roll-off by polishing the surface of the main plane using an abrasive cloth with a hardness under a pressure acting on the single crystal wafer and a polishing rate, a distance D of the facet roll-off being determined to avoid a defocusing of a mark pattern on the single crystal wafer by an optical system.

According to a second feature of the present invention, the hardness of the abrasive cloth is preferably 75 to 79 according to Asker-C standard, the pressure acting on the wafer is preferably 80 to 50 g/cm$^2$, and the polishing rate is 2 preferably to 4 μm/min.

According to a third feature of the present invention, the distance D of the facet roll-off of the ridge is preferably equal to or less than 40 μm.

According to a fourth feature of the present invention, the distance D of the facet roll-off of the ridge is more preferably equal to or less than 20 μm.

According to a fifth feature of the present invention, the single crystal wafer is preferably made of III-V group compound semiconductor.

According to a sixth feature of the present invention, the single crystal wafer is preferably made of II-VI group compound semiconductor.

According to a seventh feature of the present invention, a single crystal wafer for a semiconductor laser, comprises:
a surface of a main plane;
a cleavage surface composing an orientation flat part; and
a ridge made by the surface of the main plane and the cleavage surface;
wherein the ridge has a distance D of a facet roll-off which is determined to avoid a defocusing of a mask pattern on the single crystal wafer by an optical system.

According to an eighth feature of the present invention, a method for fabricating a single crystal wafer for a semiconductor laser, comprises the step of:
polishing a main plane surface of the single crystal wafer using an abrasive cloth with a hardness under a pressure acting on the single crystal wafer and a polishing rate, wherein the hardness of the abrasive cloth is selected to be a hardness of 75 to 79 according to Asker-C standard, the pressure is selected to be a pressure of 80 to 50 g/cm$^2$, and the polishing rate is selected to be a polishing rate of 2 to 4 μm/min.

According to a ninth feature of the present invention, the method for fabricating a single crystal wafer for a semiconductor laser may further comprise the step of:
providing a single crystal wafer having a ridge of a facet roll-off having a distance which is equal to or less than 40 μm.

While quality requirement and price reduction as regard to devices applied to LD for DVD and CD apparatus become severer than before, a deterioration of process yield due to a misalignment of pattern becomes an issue. As a result of investigation of cause of the yield deterioration, it was found that the yield is significantly affected by the facet roll-off formed at an area of an outer periphery of the wafer, which is distant for about 250 μm from the wafer surface. In the prior arts such as JP-A-2000-068171 and JP-A-2001-351836, the above problem in a microscopic level is not considered and the polishing conditions are not determined. Therefore, according to the prior arts, it is difficult to control the facet roll-off formed at a 250 μm area of the outer periphery of the wafer in mechanical polishing, so as to reduce the facet roll-off. Therefore, it is concerned that the facet roll-off may cause the deterioration in the process yield in the conventional LD chip manufacturing process.

For solving the problem of deterioration of the alignment accuracy, the present invention provides a single crystal wafer for a semiconductor laser, in which a facet roll-off of a ridge of an OF cleavage surface is equal to or less than 40 μm, as a semiconductor wafer structure. In addition, for improving the alignment accuracy, it is more preferable to control the facet roll-off of the ridge of the OF cleavage surface to be smaller, i.e. equal to or less than 20 μm.

According to the present invention, a single crystal wafer for a semiconductor laser having a small facet roll-off of a ridge of an OF cleavage surface, e.g. equal to or less than 40 μm, can be provided as a wafer structure for semiconductor laser. According to this structure, it is possible to realize an improvement in alignment accuracy of mask pattern using an optical alignment method, and an improvement in a process yield in manufacturing the LD chip.

BRIEF DESCRIPTION OF THE DRAWINGS

The present invention will be explained in more detail in conjunction with appended drawings, wherein:

FIGS. 1A to 1D are diagrams showing a process of forming a cleavage surface (OF part);

FIG. 2A is a diagram showing a shape of a single crystal wafer for a semiconductor laser, and FIGS. 2B to 2E are diagrams showing an outline of a process for fabricating a semiconductor laser diode (LD) chip using a single crystal wafer for a semiconductor laser as shown in FIG. 2A;

FIGS. 3A and 3B are diagrams showing a state of a facet roll-off which causes an alignment process defective in a conventional single crystal wafer for semiconductor laser, wherein FIG. 3A is a plan view and FIG. 3B is an enlarged cross section of a ridge of a cleavage surface;

FIGS. 4A and 4B are diagrams showing a state of a facet roll-off which causes less alignment process defective in a conventional single crystal wafer for semiconductor laser, wherein FIG. 4A is a plan view and FIG. 4B is an enlarged cross section of a ridge of a cleavage surface; and FIGS. 5A to 5D are diagrams showing an outline of a polishing process for polishing a single crystal wafer for a semiconductor laser, wherein FIG. 5A is a diagram showing a perspective view of a polishing apparatus, and FIGS. 5B to 5D are diagrams showing a relationship between a processing pressure and the facet roll-off in a wafer polishing process.

DESCRIPTION OF THE PREFERRED EMBODIMENTS

Preferred embodiments according to the present invention will be explained in detail hereinafter by referring to the appended drawings.

Figure 4A:
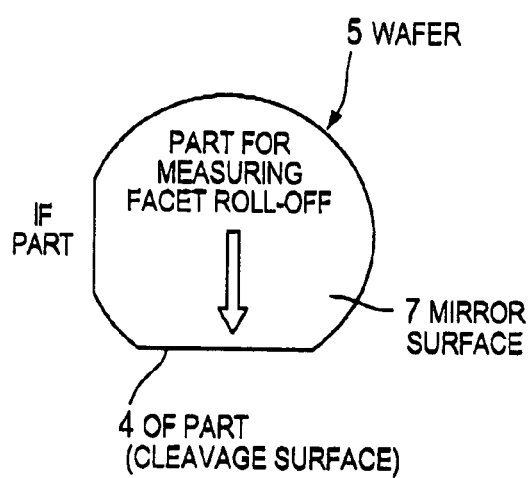
Figure 4B:
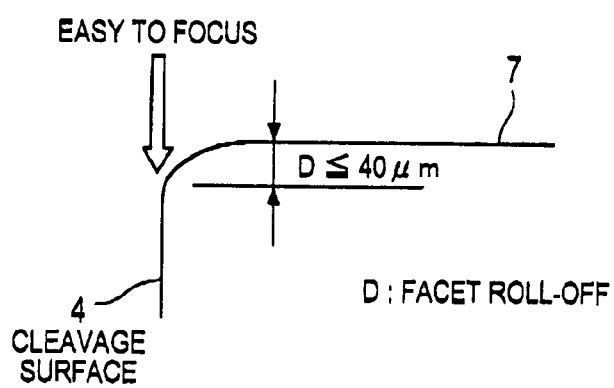
Figure 5A:
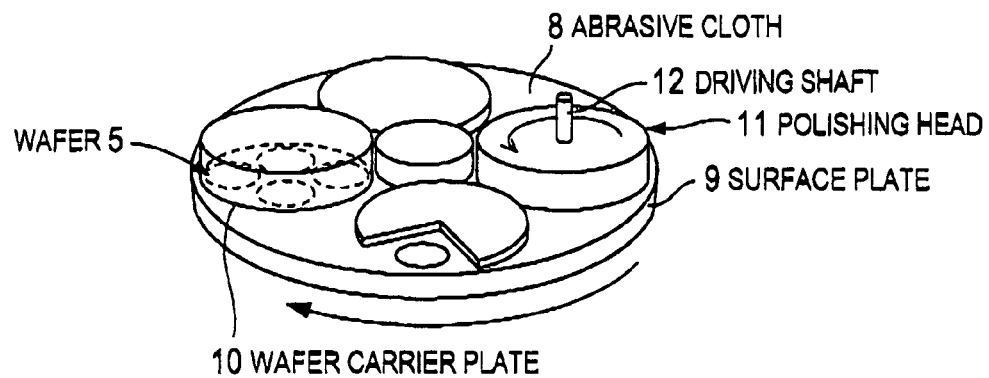
Figure 5B:
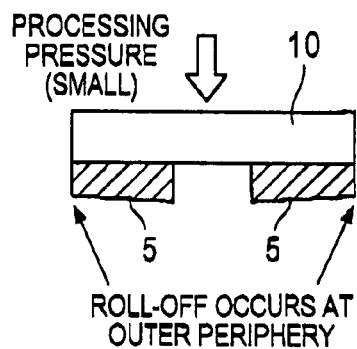
Figure 5C:
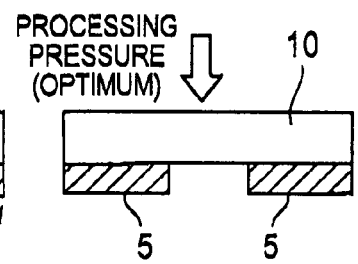
Figure 5D:
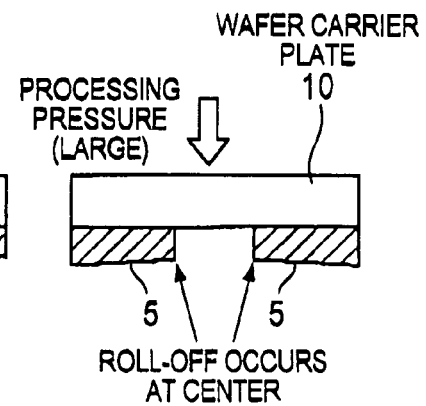

FIGS. 4A and 4B are diagrams showing a state of a facet roll-off of a single crystal wafer for a semiconductor laser without misalignment in a preferred embodiment according to the present invention. FIGS. 5A is a diagram showing a perspective view of a polishing apparatus, and FIGS. 5B to 5D are diagrams showing a relationship between a processing pressure and the facet roll-off in a wafer polishing process.

Figure 3A:
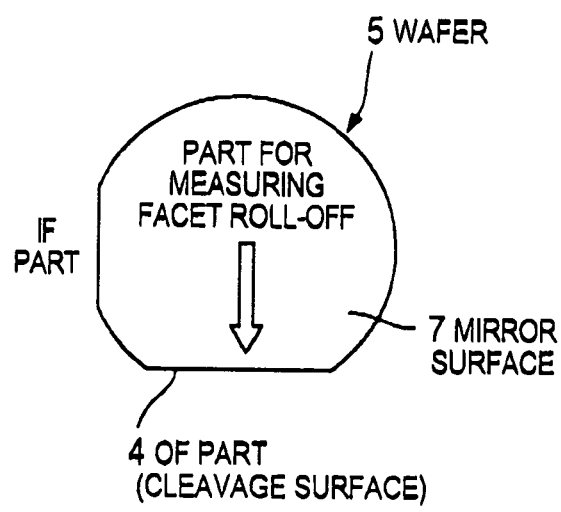
Figure 3B:
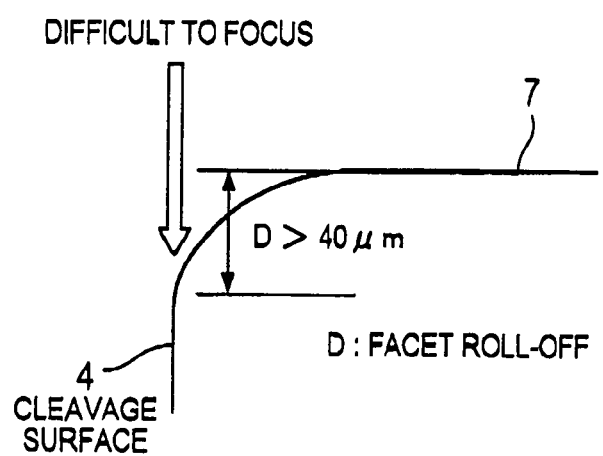

In the prior art, a variation of the polishing conditions causes the facet roll-off at an outer periphery of the wafer including the OF cleavage surface (D>40 μm, see FIG. 3B), so that it becomes difficult to focus on the OF cleavage surface using the microscope in the alignment of the mask pattern, thereby deteriorating the accuracy in the alignment of the mask pattern. As a result of investigating a relationship between the polishing conditions and the facet roll-off in the polishing, it is found that, in a mechanism of occurring the facet roll-off, a shape of the facet roll-off at the outer periphery of the wafer is greatly affected by three factors, i.e. (1) hardness of abrasive cloth, (2) polishing rate, and (3) pressure for pushing a wafer.

As shown in FIG. 5A, polishing apparatus used for polishing comprises a rotatable surface plate 9, an abrasive cloth 8 affixed to the surface plate 9, and a polishing head 11 including a wafer carrier plate 10 positioned facing to the surface plate 9 and a driving shaft 12. In polishing operation, a polishing liquid is supplied from a polishing liquid feed pipe (not shown) on the abrasive cloth 8, and a plurality of single crystal wafers 5 for semiconductor laser are carried on a carrying surface of the wafer carrier plate 10 by using a wax for carrying (wafer adhesive), then the polishing head 11 is pressurized to press the wafer surface against the abrasive cloth 8 for polishing the wafer.

In the aforementioned polishing apparatus, since the polishing liquid is provided around an outer periphery of the wafer carrier plate 10, the polishing rate across a whole surface of a respective single crystal wafer 5 becomes uneven. When the pressure for pushing the wafer 5 is small, a polishing rate at an area of the wafer 5 positioned near the outer periphery of the wafer carrier plate 10 tends to be higher than that of other area of the wafer 5 positioned around a center of the wafer carrier plate 10. Therefore, the facet roll-off occurs at the area of the wafer 5 positioned near the outer periphery of the wafer carrier plate 10 as shown in FIG. 5B.

On the other hand, when the pressure for pushing the wafer 5 is large, a polishing rate at the area of the wafer 5 positioned near the outer periphery of the wafer carrier plate 10 tends to be lower than that of the other area of the wafer 5 positioned around a center of the wafer carrier plate 10. Therefore, the facet roll-off occurs at the area of the wafer 5 positioned around the center of the wafer carrier plate 10 as shown in FIG. 5D.

However, as to the three factors of the polishing conditions, the Inventor of the present invention found that the polishing rate on the whole surface of the respective wafer 5 can be controlled by using an abrasive cloth with high hardness as the abrasive cloth 8 and by optimizing the pressure for pushing the wafer 5 (as shown in FIG. 5B) and the polishing rate such that the pressure applied on the surface of the wafer 5 becomes uniform. As a result, the Inventor succeeded in developing the technology to control the facet roll-off D occurring at the OF cleavage surface at the outer periphery of the single crystal wafer 5 to be equal to or less than 40 μm ($D \leq 40$ μm) as shown in FIG. 4B.

In other words, a single crystal wafer 5 for semiconductor laser having an orientation flat with a reduced facet roll-off (facet roll-off D) at a ridge of the OF cleavage surface 4 can be obtained, by polishing a surface of the single crystal wafer 5 for semiconductor laser having an orientation flat formed by cleaving by using the abrasive cloth 8 with high hardness under the optimized pressure for pushing the wafer 5 and polishing rate, such that the polishing rate on the whole surface of the respective wafer 5 becomes uniform.

By way of example only, the polishing conditions may be determined as follows. A hardness of abrasive cloth 8 is 75 to 79 according to Asker-C standard, a pressure for pushing the wafer 5 is 80 to 50 g/cm$^2$, and a polishing rate is 4 to 2 μm/min. Herein, the Asker-C standard means the hardness measured by Asker® C-type durometer, which is defined in SRIS (The Society of Rubber Industry, Japan, Standard).

For operating an optical alignment of mask pattern, an OF cleavage surface of a single crystal wafer for a semiconductor laser is used as a reference, so that a high precision in focusing of the microscope on the OF cleavage surface is required. Therefore, in the polishing process, the surface of the wafer 5 is required to be flatter than the conventional wafer, in other words, such precision of polishing that the OF cleavage surface 4 and the mirror surface 7 are accurately orthogonal to each other is required. The three parameters of the polishing conditions are optimized to be a hardness of abrasive cloth 8 of 75 to 79 according to Asker-C standard, a pressure for pushing the wafer of 80 to 50 g/cm$^2$, and a polishing rate of 4 to 2 μm/min. As a result, the facet roll-off D of the OF cleavage surface 4 can be controlled to be equal to or less than 40 μm ($D \leq 40$ μm).

In particular, when the three conditions are determined as a hardness of abrasive cloth 8 of 79 according to Asker-C standard, a pressure for pushing the wafer 5 of 50 g/cm$^2$, and a polishing rate of 2 μm/min, the facet roll-off D of the OF cleavage surface 4 can be controlled to be equal to or less than 20 μm ($D \leq 20$ μm). According to this structure, it is possible to achieve a value of 98 to 100% for a process yield in the optical alignment of mask pattern.

Embodiments

Next, a single crystal wafer for a semiconductor laser in embodiments according to the present invention will be explained.

As shown in TABLE 1, a single crystal wafer for a semiconductor laser comprising of n-GaAs substrate having a diameter of 7.62 cm (3 inches) is manufactured according to a comparative example, first embodiment, and second embodiment, respectively, in which the three parameters of the polishing conditions (hardness of abrasive cloth, polishing rate, and pressure of pushing wafer) are changed, respectively. Then, the relationship between the polishing conditions and the facet roll-off D in the OF cleavage surface of each wafer was examined. Further, a LD chip is manufactured by growing an AlGaAs epitaxial layer by MOVPE method on a mirror surface of the single crystal wafer for a semiconductor laser, each of which is obtained by the comparative example, first embodiment and second embodiment, and the alignment process fraction defective for each manufactured LD chip was examined. The examination result is shown in TABLE 1.

TABLE 1

| Item | Comparative Example | First Embodiment | Second Embodiment |
|---|---|---|---|
| Polishing rate | 5 μm/min | 4 μm/min | 2 μm/min |
| Applied pressure | 100 g/cm² (per sheet) | 80 g/cm² (per sheet) | 50 g/cm² (per sheet) |
| Hardness of abrasive cloth | 71 (Asker-C) | 75 (Asker-C) | 79 (Asker-C) |
| Facet roll-off of OF cleavage surface | >45 μm | 30 to 35 μm | 15 to 20 μm |
| Alignment process fraction defective | 40 to 60% | 5 to 10% | <1% |

COMPARATIVE EXAMPLE

In the comparative example, a hardness of abrasive cloth 8 is 71 according to Asker-C standard, which is soft as an abrasive cloth hardness, a pressure for pushing the wafer 5 (applied pressure) is 100 g/cm², which is high as an applied pressure, and a polishing rate is 5 μm/min, which is high as a polishing rate. In this case, the facet roll-off D of the OF cleavage surface 4 is greater than 45 μm. Namely, a distance from the mirror surface 7 to a border between the flat part and the curved part of the OF cleavage surface 4 in a vertical direction is greater than 45 μm. The alignment process fraction defective is 40 to 60%, which is large as the fraction defective.

First Embodiment

In the first embodiment, a hardness of abrasive cloth 8 is 75 according to Asker-C standard, which is middle as a abrasive cloth hardness, a pressure for pushing the wafer 5 (applied pressure) is 80 g/cm², which is middle as an applied pressure, and a polishing rate is 4 μm/min, which is middle as a polishing rate. In this case, the facet roll-off D of the OF cleavage surface 4 is 30 to 35 μm, which is small as the facet roll-off. Namely, a distance from the mirror surface 7 to a border between the flat part and the curved part of the OF cleavage surface 4 in a vertical direction is 30 to 35 μm. The alignment process fraction defective is 5 to 10%, which is small as the fraction defective.

Second Embodiment

In the second embodiment, a hardness of abrasive cloth 8 is 79 according to Asker-C standard, which is hard as an abrasive cloth hardness, a pressure for pushing the wafer 5 (applied pressure) is 50 g/cm², which is middle as an applied pressure, and a polishing rate is 2 μm/min, which is low as a polishing rate. In this case, the facet roll-off D of the OF cleavage surface 4 is 15 to 20 μm, which is small as the facet roll-off. Namely, a distance from the mirror surface 7 to a border between the flat part and the curved part of the OF cleavage surface 4 in a vertical direction is 15 to 20 μm. The alignment process fraction defective is less than 1%.

As clearly understood from the above result shown in TABLE 1, when the facet roll-off exceeds 45 μm, the alignment process fraction defective is increased, and when the facet roll-off D is controlled to be equal to or less than 20 μm, the alignment process fraction defective is reduced to be less than 1%.

In the preferred embodiment, GaAs wafer which is a III-V group compound semiconductor is made example as a single crystal wafer for a semiconductor laser, however, the present invention is not limited thereto, and can be applied to other III-V group and II-VI group compound semiconductor wafer, such as InP wafer, GaN wafer.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A single crystal wafer for a semiconductor laser, comprising:
   a surface of a main plane on which an epitaxial growth is to be conducted;
   an orientation flat part comprising a cleavage surface; and
   a ridge made by the surface of the main plane and the cleavage surface;
   wherein the ridge has a facet roll-off and a distance D of the facet roll-off between the surface of the main plane and the orientation flat part is not less than 15 μm and not more than 40 μm, and
   wherein the facet roll-off is 250 μm or less in a surface direction.

2. The single crystal wafer for a semiconductor laser according to claim 1, wherein the distance D is not less than 15 μm and not more than 20 μm.

3. The single crystal wafer for a semiconductor laser according to claim 1, wherein the facet roll-off is generated by polishing the surface of the main plane to provide a mirror surface after orientation flat processing.

4. The single crystal wafer for a semiconductor laser according to claim 1, wherein the facet roll-off is generated by polishing the surface of the main plane using an abrasive cloth with a hardness under a pressure acting on the single crystal wafer and a polishing rate.

5. The single crystal wafer for a semiconductor laser according to claim 4, wherein the hardness of the abrasive cloth is 75 to 79 according to Asker-C standard, the pressure acting on the wafer is 80 to 50 g/cm², and the polishing rate is 2 to 4 μm/min.

6. The single crystal wafer for a semiconductor laser according to claim 1, wherein the surface of the main plane on which the epitaxial growth is to be conducted is a polished mirror surface.

7. A single crystal wafer for a semiconductor laser, comprising:
   a surface of a main plane configured for epitaxial growth;
   an orientation flat part comprising a cleavage surface; and
   a ridge made by the surface of the main plane and the cleavage surface;
   wherein the ridge has a facet roll-off and a distance D of the facet roll-off between the surface of the main plane and the orientation flat part is not less than 15 μm and not more than 40 μm, and
   wherein the facet roll-off is 250 μm or less in a surface direction.

8. The single crystal wafer for a semiconductor laser according to claim 7, wherein the distance D is not less than 15 μm and not more than 20 μm.

9. The single crystal wafer for a semiconductor laser according to claim 7, wherein the facet roll-off is generated by polishing the surface of the main plane to provide a mirror surface after orientation flat processing.

10. The single crystal wafer for a semiconductor laser according to claim 7, wherein the facet roll-off is generated by polishing the surface of the main plane using an abrasive cloth with a hardness under a pressure acting on the single crystal wafer and a polishing rate.

11. The single crystal wafer for a semiconductor laser according to claim 10, wherein the hardness of the abrasive cloth is 75 to 79 according to Asker-C standard, the pressure acting on the wafer is 80 to 50 g/cm$^2$, and the polishing rate is 2 to 4 μm/min.

12. The single crystal wafer for a semiconductor laser according to claim 7, wherein the surface for epitaxial growth is a polished mirror surface.

* * * * *